United States Patent [19]

Pullen, Jr.

[11] Patent Number: 4,639,623

[45] Date of Patent: Jan. 27, 1987

[54] HIGH SENSITIVITY SIGNAL DETECTOR

[76] Inventor: Keats A. Pullen, Jr., 2807 Jerusalem Rd., Kingsville, Md. 21087

[21] Appl. No.: 630,458

[22] Filed: Jul. 13, 1984

[51] Int. Cl.⁴ .................... G06F 7/556; H03K 5/153
[52] U.S. Cl. .................... 307/492; 307/362; 307/317 R; 328/144; 328/26
[58] Field of Search ............. 307/231, 350, 362, 264, 307/492, 459, 317 R; 328/146, 144, 26

[56] References Cited

U.S. PATENT DOCUMENTS

| | | | |
|---|---|---|---|
| 2,956,159 | 10/1960 | Ebbinge | 307/200 R |
| 3,054,963 | 9/1962 | Medley | 329/204 |
| 3,093,783 | 6/1963 | Hass | 307/317 R |
| 3,648,062 | 3/1972 | Bozoian | 328/26 |
| 3,816,758 | 6/1974 | Berger et al. | 307/459 |
| 3,829,204 | 8/1974 | Farnsworth | 307/322 |
| 4,194,240 | 3/1980 | Davis | 363/126 |
| 4,438,353 | 3/1984 | Sano et al. | 307/459 |

OTHER PUBLICATIONS

"Analysis and Design of Digital Integrated Circuits", by D. A. Hodges et al., 1983, pp. 283-288.

*Primary Examiner*—Stanley D. Miller
*Assistant Examiner*—Richard Roseen
*Attorney, Agent, or Firm*—Saul Elbaum; Thomas E. McDonald

[57] ABSTRACT

A high efficiency diode detector for detecting low amplitude signal levels. A junction diode is biased by a stable current source to operate in a substantially square law region of the diode. A signal source having an impedance much less than the diode forward resistance in the square law region is connected to drive the diode. Signal levels in the 18 MV rms range are detected at efficiencies approaching 20%.

6 Claims, 4 Drawing Figures

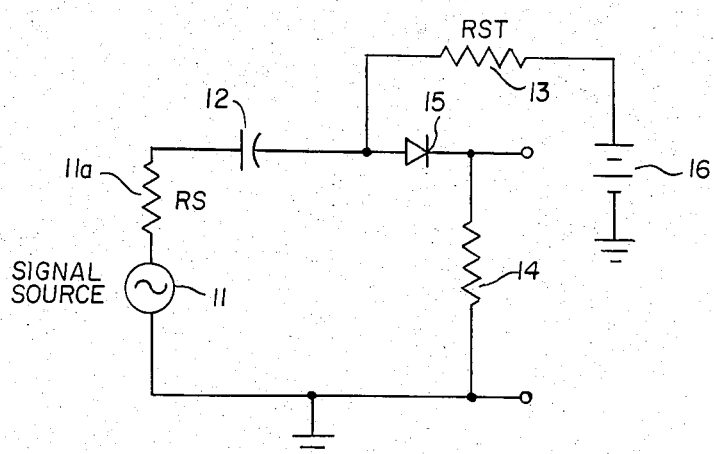
FIG 1
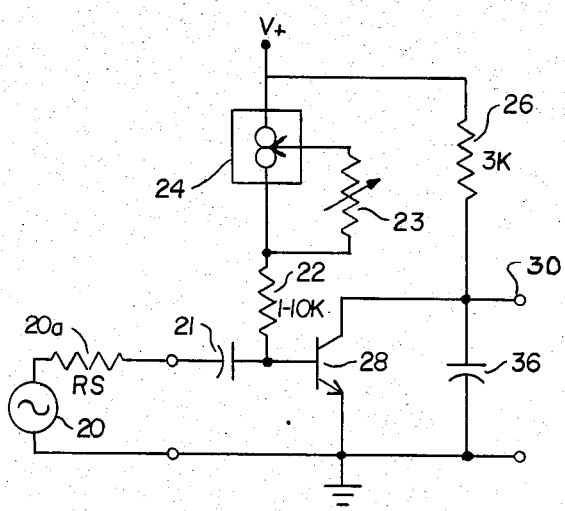
FIG 2
FIG 3
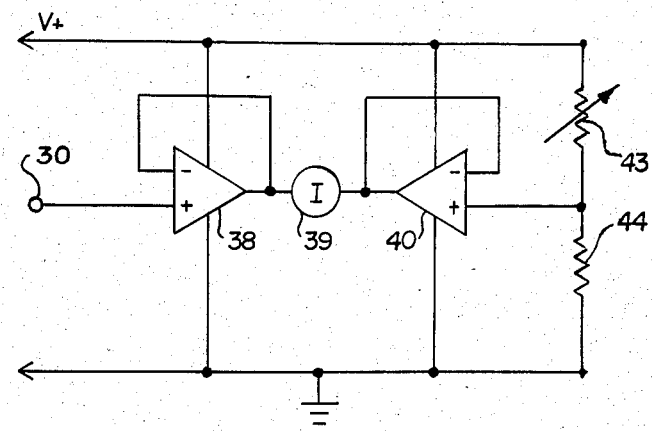
FIG 4

HIGH SENSITIVITY SIGNAL DETECTOR

The present invention relates to solid state diode detection techniques. Specifically, a detector circuit is described which provides efficient detection at low amplitude signal levels.

Solid state junction diodes have been used with great frequency as mixers, square law detectors and DC voltage generators. The diodes used in prior art circuits typically require 200–600 MV of signal level in order to enable detection due to the natural junction voltage potential.

Ideal diodes, however, are governed by the known diode equation of $$I = I_s\, e^{qV/kT}$$

where V is the applied diode junction potential, Is is the saturation current for the device, q, k and T are the electron charge, Boltzmann's constant and the absolute temperature. The ideal diode can produce for a voltage change V of 26 millivolts, a current ratio of 2.71828, and for a 2/1 current ratio less than an 18 MV voltage change in V is required.

The ideal diode operated at these potentials produce theoretical detection efficiencies of 8–12% with a signal voltage in the 18–26 millivolt range, and about 19% from voltages of about 52 millivolts. An ideal square law detector provides maximum detection efficiencies of 25%.

U.S. Pat. No. 4,194,240 demonstrates a technique for operating a diode detector with a small signal amplitude excursion. A temperature-dependent minimum forward bias voltage of about 0.6 volts must be applied to a diode before the diode begins to conduct. This minimum bias voltage, which previously made detection of signal levels having an amplitude less than 0.6 volts difficult, was avoided by driving the diode detector with a voltage-to-current converter. With the current drive, linear low level signal responses from the detector are derived. The present invention is yet another technique for improving the small signal response of a diode detector circuit.

SUMMARY OF THE INVENTION

It is an object of the invention to improve the small signal detection levels of a diode detector.

It is a more specific object of the invention to provide a diode detector circuit capable of providing high theoretical efficiency levels at small signal levels.

These and other objects are provided by a diode detector circuit in accordance with the invention. A solid state diode junction having a current VS voltage characteristic which is square law over a limited portion is connected to receive a low amplitude signal from a signal source. A load impedance is connected in series with the diode to receive a detected signal. A bias current source is connected to supply a substantially constant bias current to the diode, the bias current having a level selected to bias the diode in a region having a desired square law voltage/current response which experiences a 2/1 change in response to the signal voltage. The load impedance will generate a detection voltage in response to low level signal amplitudes of 18–26 MV at detection efficiencies approaching 20%. The diode junction may be a transistor base emitter junction with the output signal taken from the transistor collector circuit.

DESCRIPTION OF THE FIGURES

FIG. 1 is a schematic illustration of one example of the invention.

FIG. 2 demonstrates a typical load current versus junction potential characteristic for the junction diode of FIG. 1.

FIG. 3 is a schematic illustration of the preferred embodiment of the invention.

FIG. 4 demonstrates an output circuit for reading the load voltage of the detector of FIG. 3.

DESCRIPTION OF THE PREFERRED EMBODIMENT

Referring now to FIG. 1, there is shown one example of a detector circuit which has an improved sensitivity to low amplitude signal levels. A signal source 11 provides alternating signals in the amplitude range of 200 MV peak to peak. Detection signal source 11 has associated therewith an internal impedance 11a having a value of impedance represented by RS.

A capacitor 12 feeds the signal to be detected to the anode side of diode 15, the cathode side of diode 15 being connected through load resistor 14 to generate an output voltage.

Referring to FIG. 2, there is shown a standard current versus voltage curve for a junction diode which substantially agrees with the theoretical diode equation of:

$$I_0 = I_s\, e^{qV/kT}$$

where Is is the saturation current, and V is the voltage drop across the diode junction. The k is defined as Boltzmann's constant, q as the value of electron charge and T is the absolute temperature.

The diode characteristic curve in FIG. 2, being exponential, can present a square-law region at any selected operating point. The operating point selected, therefore, is based on getting an adequate static operating current level, large enough that sensitivity to stray fields and leakage currents have negligible effects, and small enough that internal parasitic resistances like base spreading resistance in the case of a transistor, and cathode or emitter spreading resistance in a diode of the appropriate junction, do not linearize the operation of the device. With small signal diodes and small signal bipolar transistors, the junction current should be in the 20 microampere to one or two milliampere range. Under these conditions, an 18 mv peak-to-peak input signal will cause a 2:1 change in junction current. Such a signal will lead to 8% distortion and a corresponding detection capability.

The appropriate bias current Io is established through a bias resistor 13 having an impedance of RST, and voltage source 16. Additionally, the source impedance 11a must have a value RS much lower, on the order of 1/10 of the input impedance of diode 15

$$RS \approx Rf/10$$

where Rf is the minimum value of the forward diode impedance.

The output impedance 14 should be selected to have a value which is, at most, comparable to one half of the value Rf. With these parameters, it is possible to detect alternating signals having amplitude levels of 0.015 volts peak to peak which will produce a current change Io of at least 1.5/1.

A preferred embodiment of the invention which provides isolation between the signal source 20 and the load impedance 26 is shown more particularly in FIG. 3. A bipolar transistor 28 is shown having a load impedance 26 in the collector circuit thereof. A current source 24, such as the LM334 adjustable current source, as manufactured by National Semiconductor Corp., establishes a bias current which biases the base emitter junction of transistor 28, such that a ±9 MV signal from signal source 20 will provide a 2/1 change of base current at a chosen level of base current. The result, after Beta multiplication in the collector circuit of transistor 28 is 2/1 incremental change in the collector current which is sensed as a change in voltage across resistor 26. The collector of the transistor 28 is connected to an output terminal 30. A capacitor 36 is connected across the collector emitter circuit of transistor 28 to avoid any high frequency oscillation of the circuit and eliminate high frequency noise. The bias current source is set by setting potentiometer 23 in accordance with the selected constant current device application notes (a device like the National Semiconductor LM 334). A series resistor 22 having a value between 1-10K ohms provides some signal voltage isolation between the signal source 20 and the current source 24.

As in the earlier example, it is necessary to select a source impedance 20a to have a value much less than the base emitter input impedance of transistor 28 when the transistor is properly biased to provide operation in the square law region, where the ±9 MV signal amplitude coupled through capacitor 21 provides the 2/1 base current change. The input impedance is given as $$RS < (kT)/(qIb)$$

The bias current is selected to yield optimum operating conditions for the transistor 28. Choice of too small a bias current will lead to an excessively high collector load resistance, making the circuit subject to stray fields and device leakage currents. Too large a bias current may cause internal parasitic resistances, the base-spreading resistance and emitter spreading resistance, to linearize the operation of the transistor, reducing the detection sensitivity of the circuit. A collector current in the range of one to five milliamperes should be satisfactory. With the foregoing detectors, it is possible to sense very low signal amplitudes while providing detection efficiencies which approach the theoretical levels of a square law detector.

The foregoing preferred embodiment of FIG. 3 may be advantageously used with an output signal measuring circuit of FIG. 4. Referring now to FIG. 4, there is shown an output circuit having two operational amplifiers 38, 40 connected as low output impedance buffer amplifiers. Amplifier 40 includes on its input voltage divider resistors 43, 44 connected to a direct voltage source V+. The input of amplifier 38 is connected to terminal 30 to receive the collector voltage of transistor 28. Equality of output voltage of amplifiers 38 and 40 is achieved by adjustment of 23 and 43.

The output circuit of FIG. 4 is operated so that in the absence of a signal from source 20, potentiometer 23 sets the output of amplifier 38 to the reference voltage provided by divider resistors 43, 44. Typical values of 43 and 44 are 22,000 and 10,000 ohms, respectively. Current detector 39, which may be a standard microammeter, registers a zero current condition. As the signal amplitude from signal source 20 changes, the current detector 39 will demonstrate a change in its reading.

Thus, there has been described a peak detector with improved sensitivity, and circuitry for advantageously measuring the detected signal levels. Those skilled in the art will recognize yet other embodiments of the invention defined by the claims which follow.

What is claimed is:

1. A detector circuit having improved sensitivity comprising:
    a direct voltage source;
    a load element;
    a transistor circuit having a common emitter, a base, and a collector connected to one end of said load element, said base and emitter forming a base-emitter junction which requires a minimum bias voltage for conduction, said common emitter and an opposite end of said load element connected to said direct voltage source;
    a stable bias current source connected to said base connection to supply a stable bias current;
    AC coupling means;
    a signal source of alternating signals having an internal impedance less than half the impedance of said base-emitter junction, said signal source being AC coupled to said base and emitter by said AC coupling means;
    said bias current selected to provide an operating current for said transistor base-emitter junction which produces a substantially square law response to said alternating signals whereby alternating signals having peak to peak voltage levels less than half said base-emitter junction minimum bias voltage produce a base current magnitude change.

2. A detector circuit having improved sensitivity comprising:
    a solid state diode having a current versus voltage characteristic which is a square law over a limited portion thereof, said diode requiring a minimum bias voltage for conduction and having a minimum forward impedance;
    a load impedance which is smaller than said diode minimum input impedance and which is connected in series with said diode;
    AC coupling means;
    a signal source which is AC coupled by said AC coupling means to supply an alternating voltage signal to said diode and load impedance, said signal source having an impedance smaller than said diode minimum forward impedance and said signal source providing a signal having an amplitude less than said diode minimum bias voltage required for conduction; and
    a bias current source connected to supply a substantially constant bias current to said diode and load impedance, said bias current selected to bias said diode whereby increments of signal voltage applied to said diode provide a square law voltage-current changes of approximately 2/1.

3. The detector circuit of claims 1 or 2 wherein said bias current is selected to be in the range of 20 microamperes to 2 milliamperes.

4. The detector circuit of claim 1 which further comprises:
    a first amplifier connected to detect a voltage at said collector;

a second amplifier having one input connected to a source of reference voltage potential;

said first and second amplifiers connected to provide unity gain; and means connected between said first and second amplifier output terminals to measure a difference in said first and second amplifiers' output voltages.

5. A detector circuit having improved sensitivity comprising:

a solid state diode having a minimum input impedance and a current versus voltage characteristic which is a square law function over a limited portion thereof, said diode requiring a minimum bias voltage for conduction;

a load impedance which is no greater than half the minimum input impedance of said diode and which is connected in series with said diode;

a bias current source connected to supply a substantially constant current to said diode and load impedance;

AC coupling means;

a source which is AC coupled by said AC coupling means to supply an alternating voltage signal to said diode and load impedance, said signal source having an impedance less than half the minimum input impedance of said diode;

wherein said bias current is selected to provide an operating current for said diode which produces a substantially square law response to said alternating signals, whereby alternating signals having peak to peak voltage levels less than half said diode minimum bias voltage produce a diode current magnitude change.

6. The detector circuit of claim 5, wherein said signal source has an impedance which is approximately one order of magnitude less than the minimum input impedance of said diode.

* * * * *